United States Patent
Hsu et al.

(10) Patent No.: US 7,305,515 B2
(45) Date of Patent: Dec. 4, 2007

(54) PERFORMANCE OPTIMIZING COMPILER FOR BUILDING A COMPILED DRAM

(75) Inventors: Louis L. Hsu, Fishkill, NY (US); Rajiv V. Joshi, Yorktown Heights, NY (US); John A. Fifield, Underhill, VT (US); Wayne F. Ellis, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 1281 days.

(21) Appl. No.: 09/793,037

(22) Filed: Feb. 26, 2001

(65) Prior Publication Data

US 2002/0170019 A1    Nov. 14, 2002

(51) Int. Cl.
G06F 12/00 (2006.01)
G06F 13/00 (2006.01)
G06F 13/28 (2006.01)

(52) U.S. Cl. .................... 711/105; 711/170; 716/2; 716/8

(58) Field of Classification Search ............... 716/1–3, 716/17, 8; 365/230.01, 200, 222, 210; 711/105, 711/106, 170
See application file for complete search history.

(56) References Cited

U.S. PATENT DOCUMENTS

| | | | | |
|---|---|---|---|---|
| 5,517,634 A | * | 5/1996 | Ehrlich | 711/166 |
| 5,883,814 A | * | 3/1999 | Luk et al. | 716/2 |
| 6,002,633 A | | 12/1999 | Oppold et al. | 365/230.03 |
| 6,115,310 A | * | 9/2000 | Netis et al. | 365/210 |
| 6,356,503 B1 | * | 3/2002 | Roy | 365/230.06 |
| 6,388,931 B1 | * | 5/2002 | Wilkins | 365/210 |
| 6,584,604 B2 | * | 6/2003 | Inada | 716/8 |

* cited by examiner

*Primary Examiner*—Meng-al T. An
*Assistant Examiner*—Jue S Wang
(74) *Attorney, Agent, or Firm*—Brian P. Verminski, Esq.

(57) ABSTRACT

A compiler is provided for compiling at least one array or bank unit of a DRAM macro such that electrical performance, including cycle time, access time, setup time, among other properties, is optimized. The compiler compiles the DRAM macro according to inputted information. The compiler receives an input capacity and configuration for the DRAM macro. A compiler algorithm determines a number of wordlines and bitlines required to create the DRAM macro of the input capacity. The compiler algorithm optimizes the cycle time and access time of the DRAM macro by properly configuring a support unit of the DRAM macro based upon the number of wordlines and bitlines.

23 Claims, 7 Drawing Sheets

PERFORMANCE OPTIMIZING COMPILER FOR BUILDING A COMPILED DRAM

FIELD OF THE INVENTION

This invention relates to dynamic random access memory (DRAM) arrays. In particular, the present invention relates to a method and compiler for creating at least one sub-array or bank unit of a DRAM macro.

BACKGROUND OF THE INVENTION

Each memory cell in a dual-port static random access memory (SRAM) macro or chip is a buffer or flip-flop, and data is retained as long as power is maintained to the chip. SRAM macros are realized with a bipolar technology, such as TTL, ECL, or I$^2$L or with MOS technology, such as NMOS or CMOS. Bipolar SRAMs are relatively fast, having access times of 10 to 100 nsec. Power dissipation is also high, typically, 0.1 to 1.0 mW/bit. By contrast, MOS RAM access time is typically 100 nsec and power dissipation is 25 μW/bit. The combination of high circuit density, low power dissipation, and reasonable access time has led to the dominance of MOS technology in the manufacture of RAM. Hence, dual-port SRAM macros having high-speed buffers are widely used in devices and equipment necessitating high-speed and high performance, such as microprocessors, communication networks, facsimile machines, modems, etc.

Since the memory cells of SRAM macros take up a relatively large surface area on a single integrated (IC) chip, IC design engineers, in an effort to increase the number of memory cells on the IC chip, i.e., high density, and make the chip smaller, have focused on improving dynamic RAM (DRAM) macros or chips to make them suitable for high-speed, high performance devices and equipment. Currently, the ultimate in achieving high-density and compactness, is a DRAM macro capable of storing data in the single-cell array format where each memory cell uses a capacitor to store a charge and one transistor to gate it to sense amplifier circuits.

It is desirable that high-performance memories, such as DRAM macros, can be automatically generated and optimized for performance and size by using a computer program, e.g., a compiler program. The advantages of compiling DRAM macros are (1) a short design cycle; (2) a short time to market; (3) low cost; (4) compatibility with ASIC environment; and (5) flexibility on customized specifications, such as memory size, number of banks, data bandwidth, access time, cycle time, etc.

U.S. Pat. No. 6,002,633 issued to Oppold et al. on Dec. 14, 1999 describes a compiler program for synthesizing different configurations of SRAM. However, due to the uniqueness of DRAM macros, which is described below, the same methodology cannot be applied to generate DRAM macros. In fact, it is more difficult to make DRAM macros compilable than SRAM macros, due to the different parts and functions of DRAM macros which are not easily "growable", as discussed below.

On-chip DC Generator System

Unlike an SRAM macro, a DRAM macro needs several voltage levels generated on-chip. These include, Vpp or the boosted wordline voltage (approximately 2.2 V), Vwl or the negative wordline voltage (approximately −0.5 V), substrate bias voltage (approximately −0.4 V), Vbg or bandgap reference voltage, Vref or DC reference voltage, etc. All these voltages are required to either boost the DRAM performance or enhance the charge retention time. The size of a DC generator system usually is custom designed depending on banking, refresh and pre-charge operations. These DC generator components are not needed for the SRAM macro.

Refresh Operation

Charge stored in the DRAM cells must be periodically refreshed, or otherwise, the data will be lost. The SRAM array is formed with cells where the data is latched in a cell formed by back-to-back inverters. Therefore, the data will never be lost, unless the power is removed.

The refresh operation in the DRAM is done either externally by a request from the memory controller or CPU, or internally by a refresh counter to generate refresh row address and by a refresh clock generator to determine when and which row needs to be refreshed. Therefore, as the DRAM size varies, or for a very different banking arrangement, the refresh scheme must be changed accordingly depending on refresh penalty and peak power consumption.

Power-on Circuit

For a DRAM macro during power-on, it is important to properly turn on each one of the on-chip generators in a certain sequence, so as to avoid any possibility that could lead to a latch-up problem. Normally, a power-on circuit is needed to handle the whole DRAM macro to coordinate the power-on sequence. However, the design of DC components to be used for a compilable DRAM must be able to sustain a minimum macro unit. For example, if 1 Mb is the smallest compilable DRAM unit, then at least one DC system is needed for each 1 Mb memory macro.

Banking Arrangement

In the past, DRAM has been inherently slower than SRAM. It has been proposed that one must take advantage of multiple bank techniques to double the DRAM speed to closely approximate the speed of SRAM. In other words, reading from one bank while simultaneously writing to another bank.

Other than the above-mentioned unique aspects of DRAM macros which make DRAM macros difficult to automatically generate and optimize for performance and size by using a compiler program, DRAM macros also share some of the same challenges as those of SRAM macros. For example, how to provide a clock timing which is tuneable by the array size, and how to provide a re-configurable data bandwidth to meet customer specifications.

Accordingly, there exists a need for a method and compiler for creating at least one array or bank unit of a DRAM macro of a high-performance DRAM memory system, such that electrical performance of the DRAM macro, including cycle time and access time, is optimized. It is preferred for the compiler to be able to accommodate a wide variety of customer specifications and to build DRAM macros having configurations which satisfy the wide variety of customer specifications.

SUMMARY

An aspect of the present invention is to provide a compiler for building at least one compilable DRAM including at least one compilable DRAM bank unit.

Another aspect of the present invention is to provide a method for compiling a high-performance DRAM macro such that electrical performance, including cycle time, access time, setup time, among other properties, is optimized.

Another aspect of the present invention is to provide a DRAM memory system having auto-programmable DRAM banking based on predetermined specifications, so that after compiling a DRAM macro, specific bank operation is optimized.

Further, another aspect of the present invention is to provide a compilable DRAM macro having support components, such as DC generator units, a refresh unit, a size tuneable timing control unit, etc.

Finally, another aspect of the present invention is to provide a DRAM memory system having a re-configurable data I/O bandwidth capable of meeting predetermined specifications.

Accordingly, in an embodiment of the present invention, a compiler is provided for compiling at least one array or bank unit of a DRAM macro such that electrical performance, including cycle time, access time, setup time, among other properties, is optimized. The compiler compiles the DRAM macro according to inputted information. The compiler receives an input capacity and configuration for the DRAM macro. A compiler algorithm determines a number of wordlines and bitlines required to create the DRAM macro of the input capacity. The compiler algorithm optimizes the cycle time and access time of the DRAM macro by properly configuring a support unit of the DRAM macro based upon the number of wordlines and bitlines.

DETAILED DESCRIPTION OF THE INVENTION

The present invention provides a compiler for compiling at least one array or bank unit of a DRAM macro such that electrical performance, including cycle time, access time, setup time, among other properties, is optimized. The compiler compiles the DRAM macro according to inputted information. The compiler receives an input capacity and configuration for the DRAM macro. A compiler algorithm determines a number of wordlines and bitlines required to create the DRAM macro of the input capacity. The compiler algorithm optimizes the cycle time and access time of the DRAM macro by properly configuring a support unit of the DRAM macro based upon the number of wordlines and bitlines.

Figure 1:
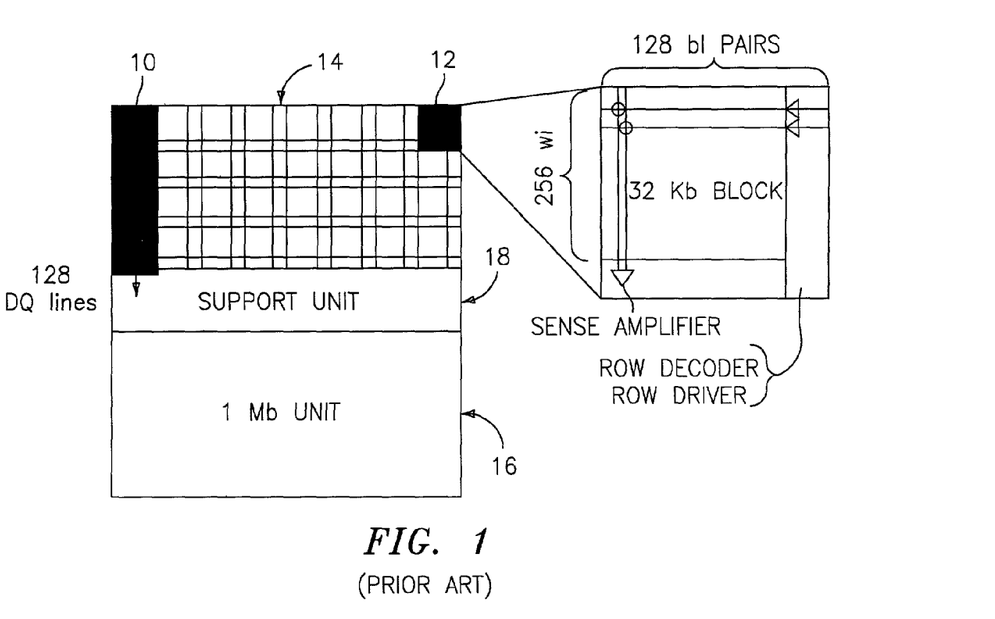
FIG. 1 is a diagram of a prior art 2 Mb unit of a DRAM memory system.

With reference to FIG. 1, there is shown a prior art 2 Mb unit of a DRAM memory system, where the minimum independently useful DRAM size is 1 Mb. As shown as an example by the left-most shaded area in FIG. 1, each bank 10 of the DRAM memory system contains four blocks. As shown as an example by the right-most shaded area and an enlarged block diagram in FIG. 1, each block 12 of the DRAM memory system contains 256 wordlines and 128 pairs of bitlines. Hence, each block 12 of the exemplary DRAM memory system can store 32 kb and each bank 10 can store 128 kb.

In FIG. 1, eight banks 10 are arranged side-by-side vertically as one 1 Mb unit. One 1 Mb unit forms an upper array 14 and another 1 Mb unit forms a lower array 16. The upper and lower arrays 14, 16 share a support unit 18 there between. Since there is no column decoder, all the data read using the 128 pairs of bitlines is transferred out. Therefore, the DRAM memory system includes 128 DQ lines running vertically from the upper array 14 to the support unit 18. Also shown by FIG. 1 are the support devices of the DRAM memory system, such as the row decoders, row drivers, and sense amplifiers.

There are many advantages of such bank arrangement. First, since each bank 10 can be accessed independently without interfering with other banks 10, the row decoder design can be very simple and small in size. Second, since each bank 10 can be accessed only for either read or write, i.e., not both, then the DQ lines along each bank 10 can be multiplexed for read or write. Otherwise, when banks 10 are stacked together in accordance with the present invention, as described below, twice the number of DQ lines would be needed for read and write operations to the different banks 10. By multiplexing the DQ lines along each bank 10, one avoids congesting the DRAM memory system with DQ lines.

Figure 2:
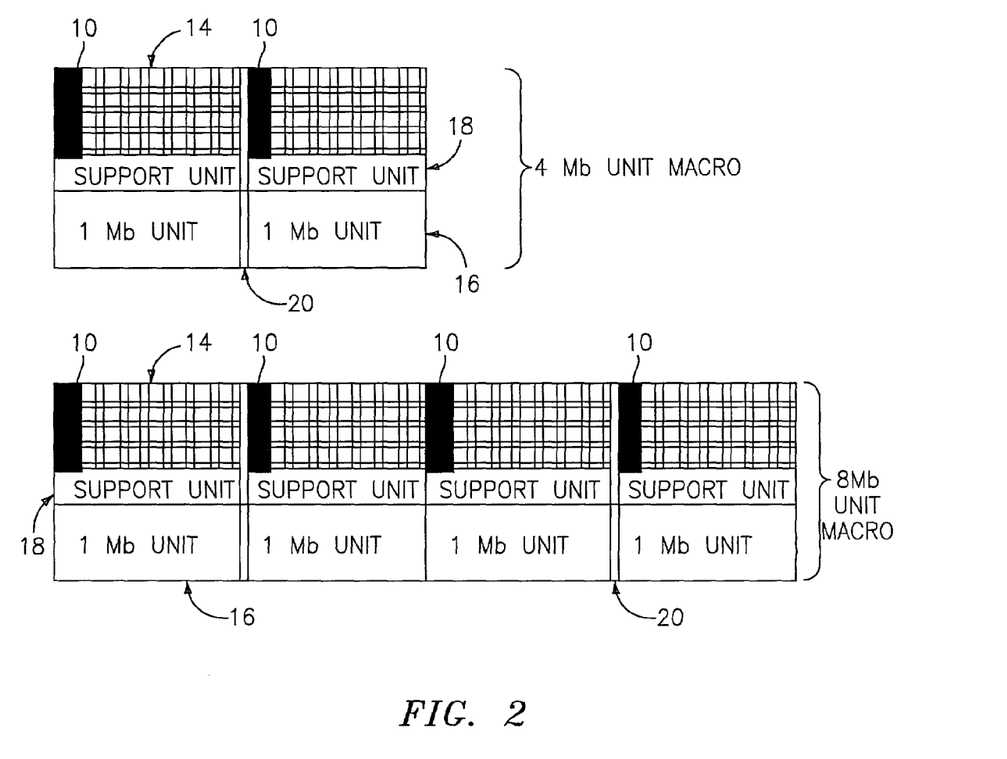
FIG. 2 is a diagram illustrating a method for stacking 2 Mb units to form a compilable DRAM macro according to the present invention.

A diagram of a method for stacking 2 Mb units by a compiler algorithm to form a compilable DRAM macro according to the present invention is shown by FIG. 2. It is noted that if no SRAM cache is associated with the DRAM memory system, for example, the DRAM memory system is used alone, then one can stack 8 to 16 blocks 12 to improve the density. However, when an SRAM cache is used to conduct high-speed caching between a CPU and the DRAM memory system, the size of the bank 10 is restricted to 128 kb. If the size of the bank 10 is not restricted, then the SRAM array size will be unreasonably large.

After a 2 Mb DRAM unit is composed, as shown in FIG. 2, one can continue to form a 4 Mb, 6 Mb, 8 Mb, etc. DRAM macro; for example, by stacking 2 Mb units side-by-side with a joint unit 20 in the middle. The joint unit 20 is used to re-drive the signal buses in the support unit 18 as known in the art for large arrays.

Accordingly, the procedure for compiling the DRAM macro according to the present invention includes the following steps: receive a minimum input memory capacity and configuration information (a minimum DRAM macro size of 1 Mb must be received); estimate how many 1 Mb of DRAM units are required; based on the received configuration, compile the bank 10, the block 12, and the support unit 18 for a 1 Mb DRAM unit based on the defined bank aspect ratio; place each pair of 1 Mb units shared with a support unit 18 to form 2 Mb DRAM units to save chip area (if this step is not performed, then each 1 Mb unit will need a separate support unit 18); and place each 2 Mb DRAM unit side-by-side having a joint unit 20 located in between the 2 Mb units until the final DRAM size is reached. The procedure is further described below with reference to an inventive algorithm.

Figure 3:
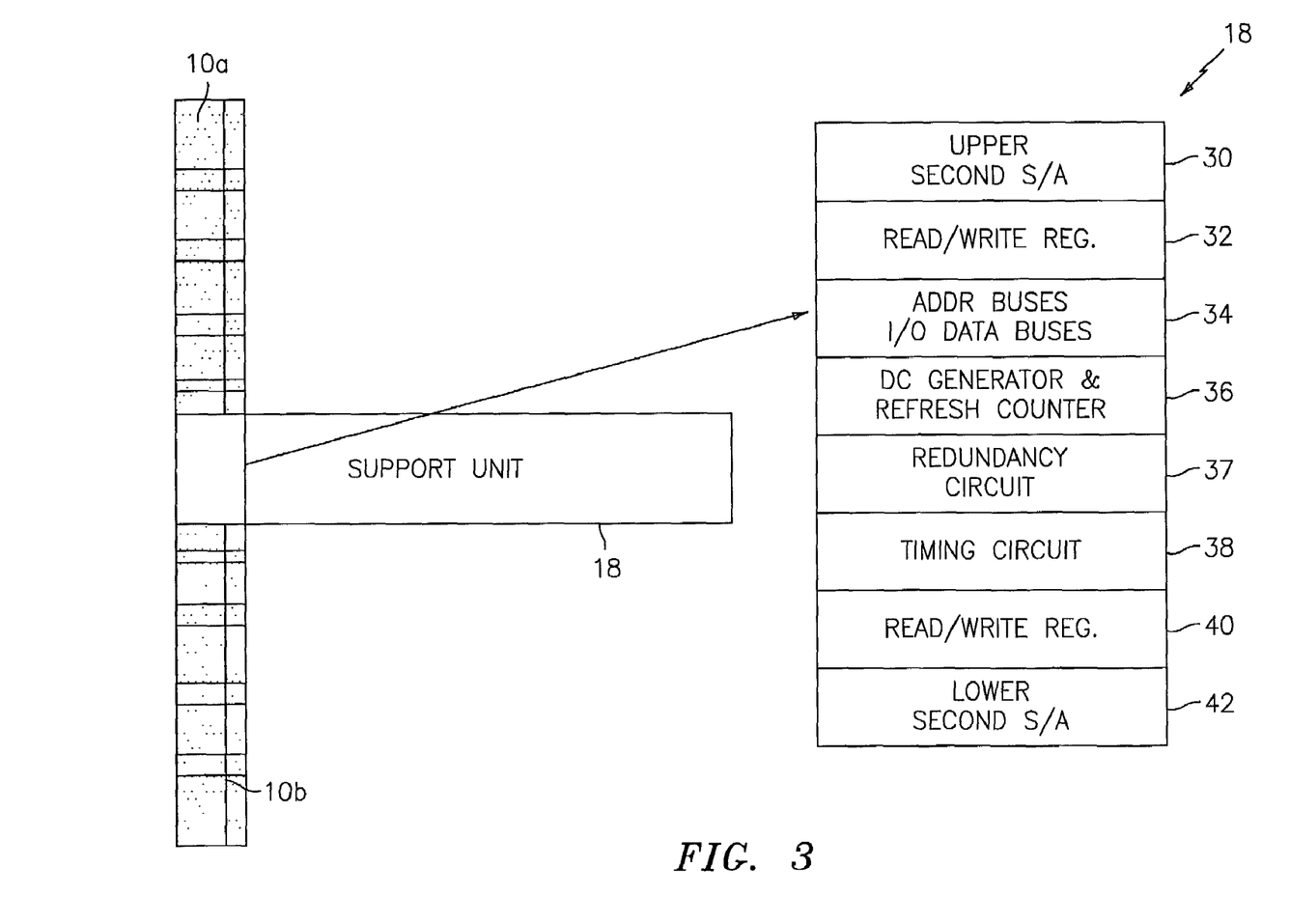
FIG. 3 is a diagram illustrating a support unit for the compilable DRAM macro of the present invention.

With reference to FIG. 3, an exemplary support unit, such as support unit 18, for each pair of 1 Mb units is divided into eight units. Each support unit 18 includes a second sense amplifier module 30 for the upper bank 10a; a read/write register 32 for the upper bank 10a; an I/O bus zone 34 having address and data buses; DC generator and refresh block 36; a redundancy circuit block 37; a timing circuit control block 38; a read/write register 40 for the lower bank 10b; and a second sense amplifier module 42 for the lower bank 10b.

The redundancy circuit block 37 provides redundancy circuits and associated fuse latches or registers for storing failed dataline addresses, i.e., addresses of defective rows and columns, for replacement purposes. That is, the fuse latches provide information in order for the column decoder to be able to know the defective datalines for replacing these datalines with good redundant datalines. The redundancy circuit block 37 is preferably made growable with the chip; as the size of the chip increases, the probability of a local dataline failure also increases. Hence, an increased number of redundant datalines are needed to replace the increased number of defective datalines.

Figure 4:
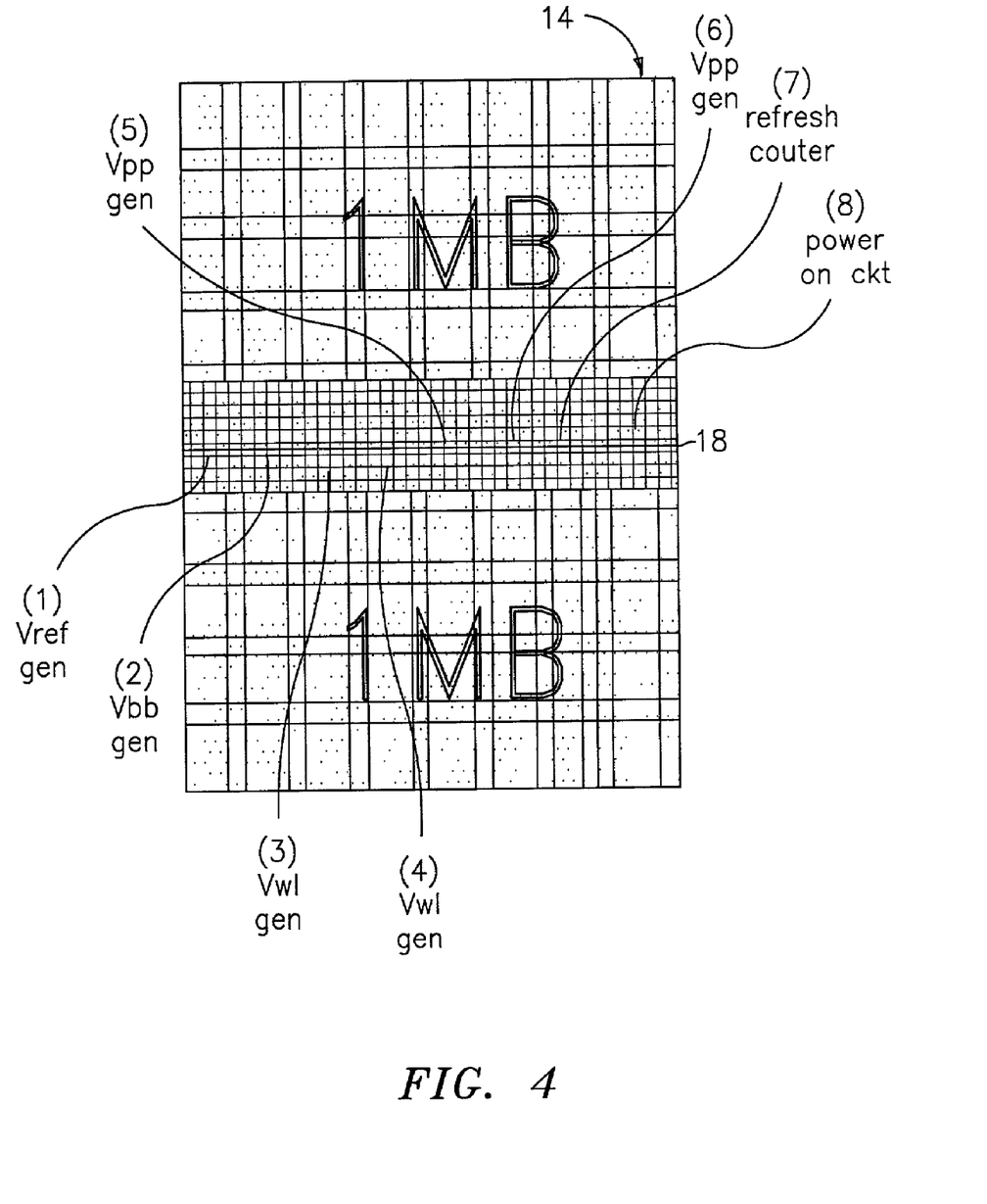
FIG. 4 is a diagram illustrating the eight DC units needed to operate the compilable DRAM macro.

FIG. 4 shows each of the eight DC units of the DC generator block 36 for operating the upper and lower arrays 14, 16 of each 2 Mb unit. These DC units include (1) Vref for generating the band-gap and DC references (a current reference Iref may also be used instead of Vref); (2) Vbb for providing a substrate bias (a pump is used for both active and standby condition to ensure the substrate of the 2 Mb DRAM is properly biased); (3) and (4) Vwl, need at least two of these pumps to support negative wordline operation, one Vwl for active negative wordline operation and one Vwl for standby negative wordline operation; (5) and (6) Vpp (for boost wordline activation), one of these pumps for active operation and another of these pumps for standby operation; (7) refresh address generator for supporting refresh of the 2 Mb unit; and (8) a power-on circuit for guiding a proper power-on sequence.

It is desirable to have a flexible compilable design for the compilable DRAM macro according to the present invention to suit different applications. Depending on the existing macro library, the computer can select the proper register with right I/O size to meet the different applications. Further, by selecting the proper register with right I/O size for the support unit 18, cycle time and access time of the built DRAM macro are optimized.

Figure 5:
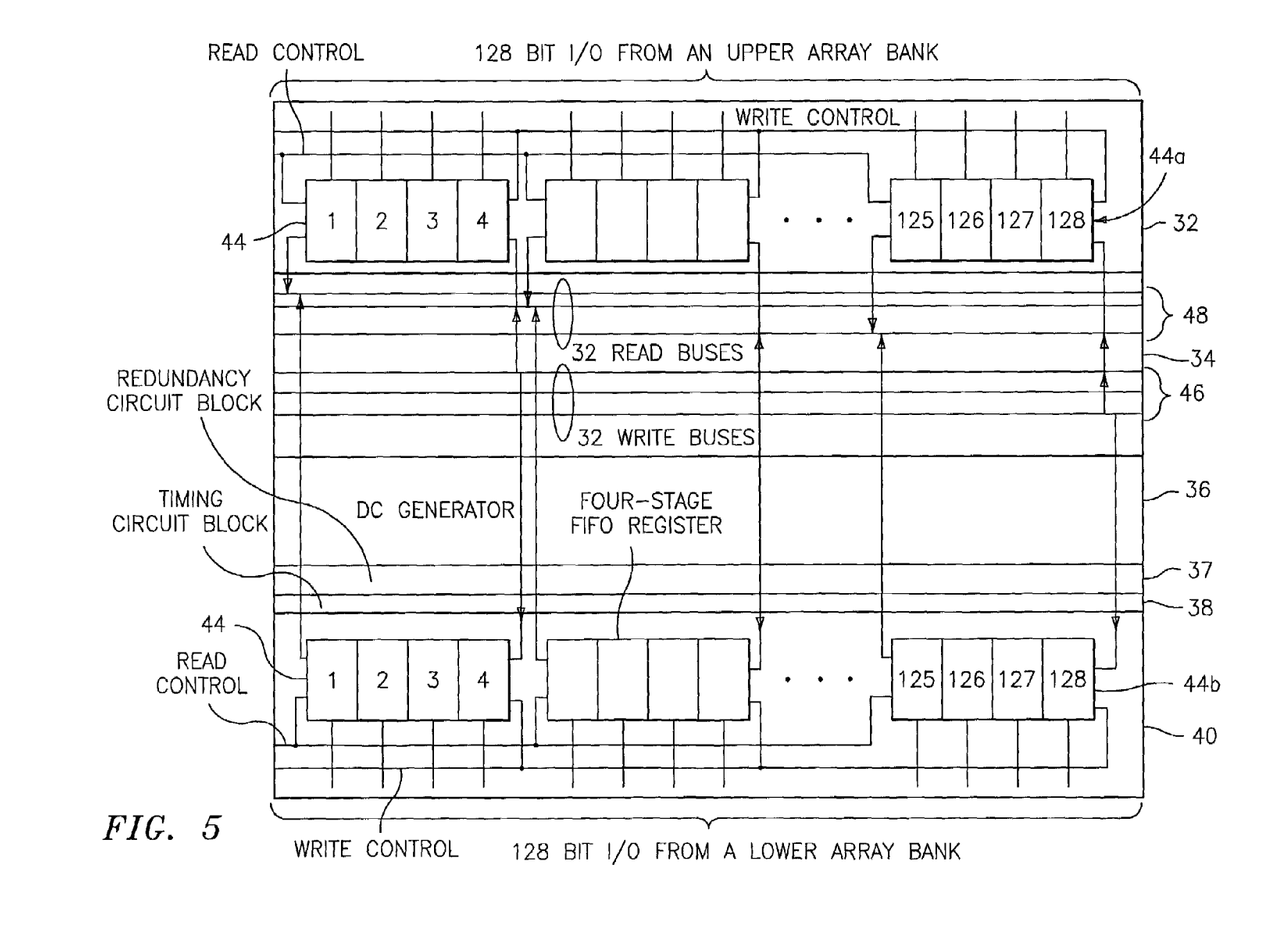
FIG. 5 is a diagram illustrating a 128 bit to 32 bit I/O configuration for the support unit of the compilable DRAM macro of the present invention.

FIG. 5 illustrates a diagram of a 128 bit to 32 bit I/O configuration for the support unit 18 of the compilable DRAM macro. The upper and lower arrays 14, 16 are designed with a fixed number of DQ lines (e.g., 128 bit). Hence, by using 4-bit shift-registers 44, 32-bit wide data-out operations are possible. That is, by simultaneously conducting a parallel-in, and serial-out operation, 128 bits are latched into the 128 four-stage FIFO registers 44. Within the next four consecutive cycles, the four bits of data in the four-stage FIFO registers 44 are burst out.

It is noted that there are a total of 32 data-in bus lines (i.e., write buses) 46 and 32 data-out bus lines (i.e., read buses) 48. It is provided that when the upper bank is selected for a read operation, the lower bank is selected for a write operation. Accordingly, the 128 bits of data can be read from the upper array 14 and be latched in the upper registers 44a. Simultaneously, the first 32 bits of external data are sent to and latched into the lower registers 44b. It will take four cycles to unload the data from the upper registers 44a via the 32 data-out bus lines 48, and also four cycles to load the lower registers 44b via the 32 data-in bus lines 46. Since, the operation of 128 bit to 32 bit I/O configuration is known in the art, a more detailed discussion of the operation thereof is omitted.

Figure 6:
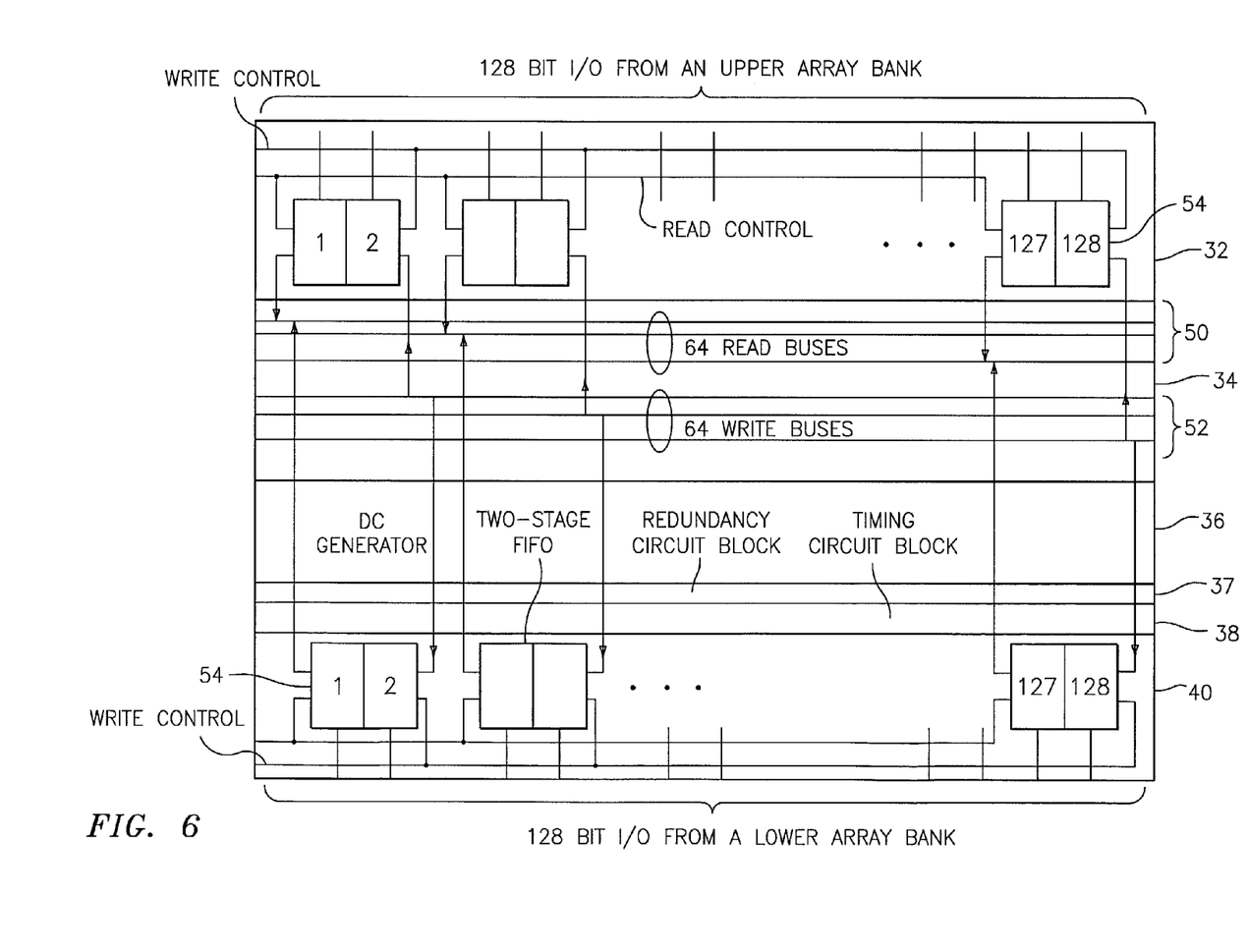
FIG. 6 is a diagram illustrating a 128 bit to 64 bit I/O configuration for the support unit of the compilable DRAM macro of the present invention.

FIG. 6 is a diagram illustrating a 128 bit to 64 bit I/O configuration for the support unit 18 of the compilable DRAM macro. The bus zone has 64 write and 64 read buses 50, 52. The registers are now grouped in pairs to form 2-bit FIFO registers 54. The operation of the 128 bit to 64 bit I/O configuration is similar to the 128 bit to 32 bit I/O configuration described above.

Figure 7A:
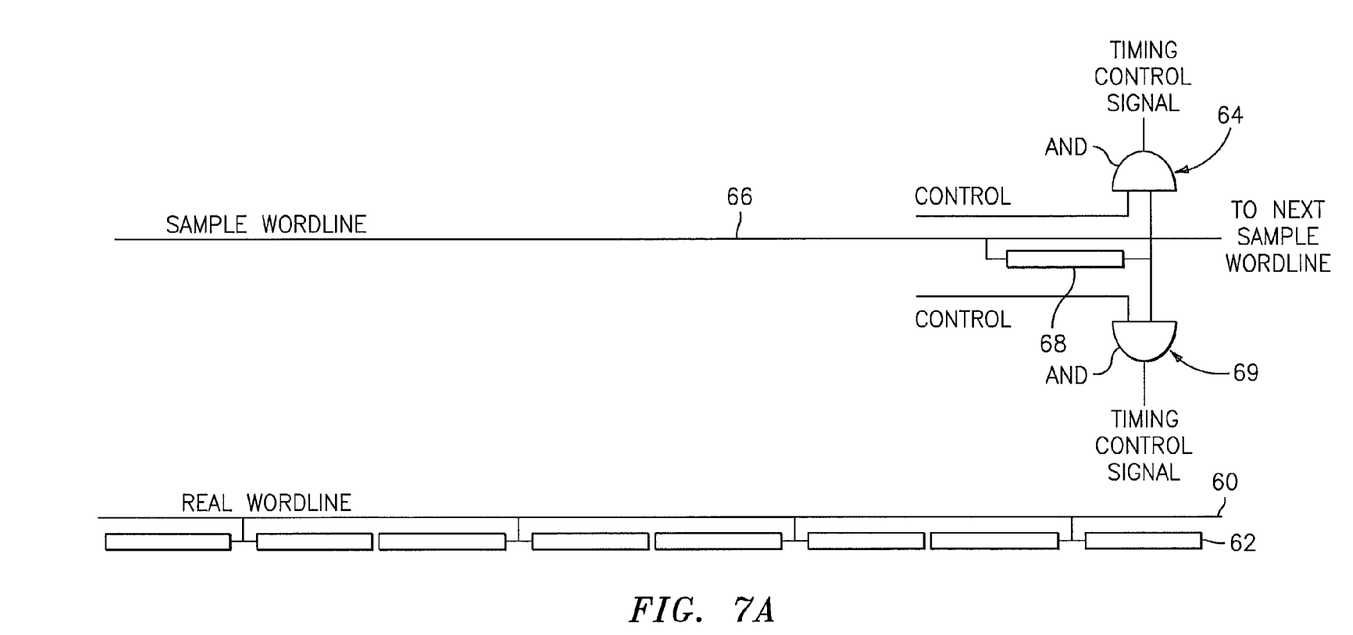
FIGS. 7A-7B are diagrams illustrating a self-tuneable timing control unit for the compilable DRAM macro of the present invention.

As the DRAM macro is increased in size, the timing delay as provided by the timing circuit block 38 must be adjusted so that operation timing (e.g., cycle time and access time), such as decoding, sensing, etc., will be performed properly throughout the DRAM macro. FIG. 7A shows a comparison of a real master wordline and sample master wordline design. Within a DRAM bank 10, a real master wordline 60 drives four local wordlines 62 in a stitched manner. The sheet resistance for the local wordline 62 made by doped polysilicon material is about 400 ohm/sq. Therefore, the most critical delay is the local wordline 62.

As shown by the sample wordline design in FIG. 7A, a timing or speed control circuit 64 is formed by a metal master wordline 66 traversing the bank 10 for providing a global timing control signal to a DRAM bank 10 or sub-array. The timing circuit 64 further includes at the end of the master wordline 66, a local wordline 68 to provide at least one local timing control signal to the DRAM bank 10 or sub-array via a local control logic circuit 69 of the timing circuit 64. The local control logic circuit 69 receives a control signal CONTROL for performing one of a write, read and refresh operation. The control signal CONTROL is received within at least one logic AND gate of the local control logic circuit 69.

Figure 7B:
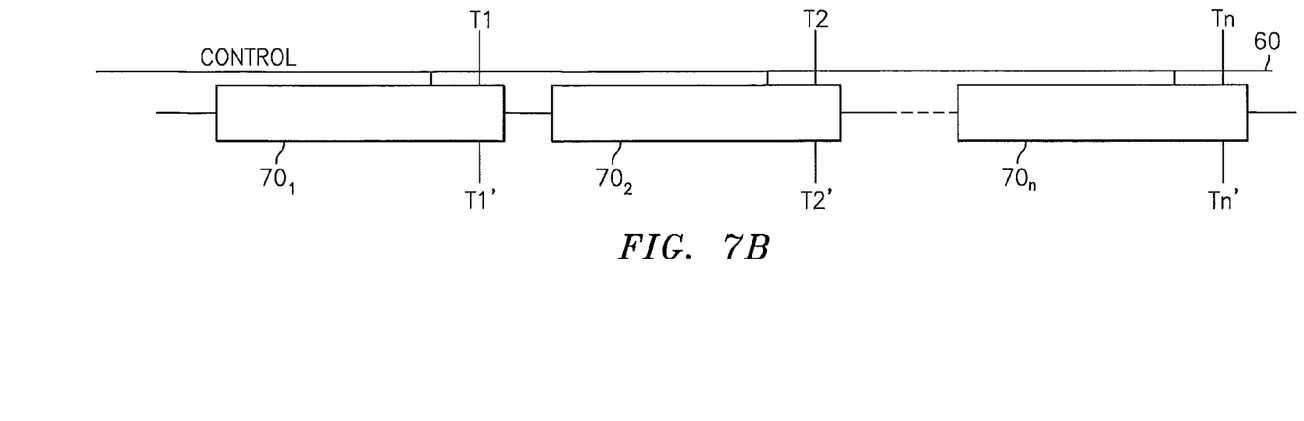

The timing circuit 64 is made in the form of timing modules 70 stacked horizontally and connected to the real master wordline 60 as shown in FIG. 7B for receiving the control signal CONTROL. Each timing module $70_{1-n}$ provides a local timing or speed control signal (indicated by T1 . . . Tn and T1' . . . Tn' in FIG. 7B) to at least one compilable sub-array of the DRAM macro, such that the at least one compilable sub-array operates as an independent locally controlled DRAM. The timing circuit 64 connects to the at least one compilable sub-array via only metal. Accordingly, the resulting delay is due primarily to the location of the bank 10, i.e., due to distance.

To compile the DRAM macro described above, a compiler is needed. The compiler includes a compiler algorithm having several sub-algorithms which are used to compile a high-performance DRAM macro based on a particular customer's specifications. The compilable DRAM macro is preferred to also have a small size and a proper aspect ratio and a design where electrical performance, including cycle time, access time, setup time, among other properties, is optimized.

Figure 8:
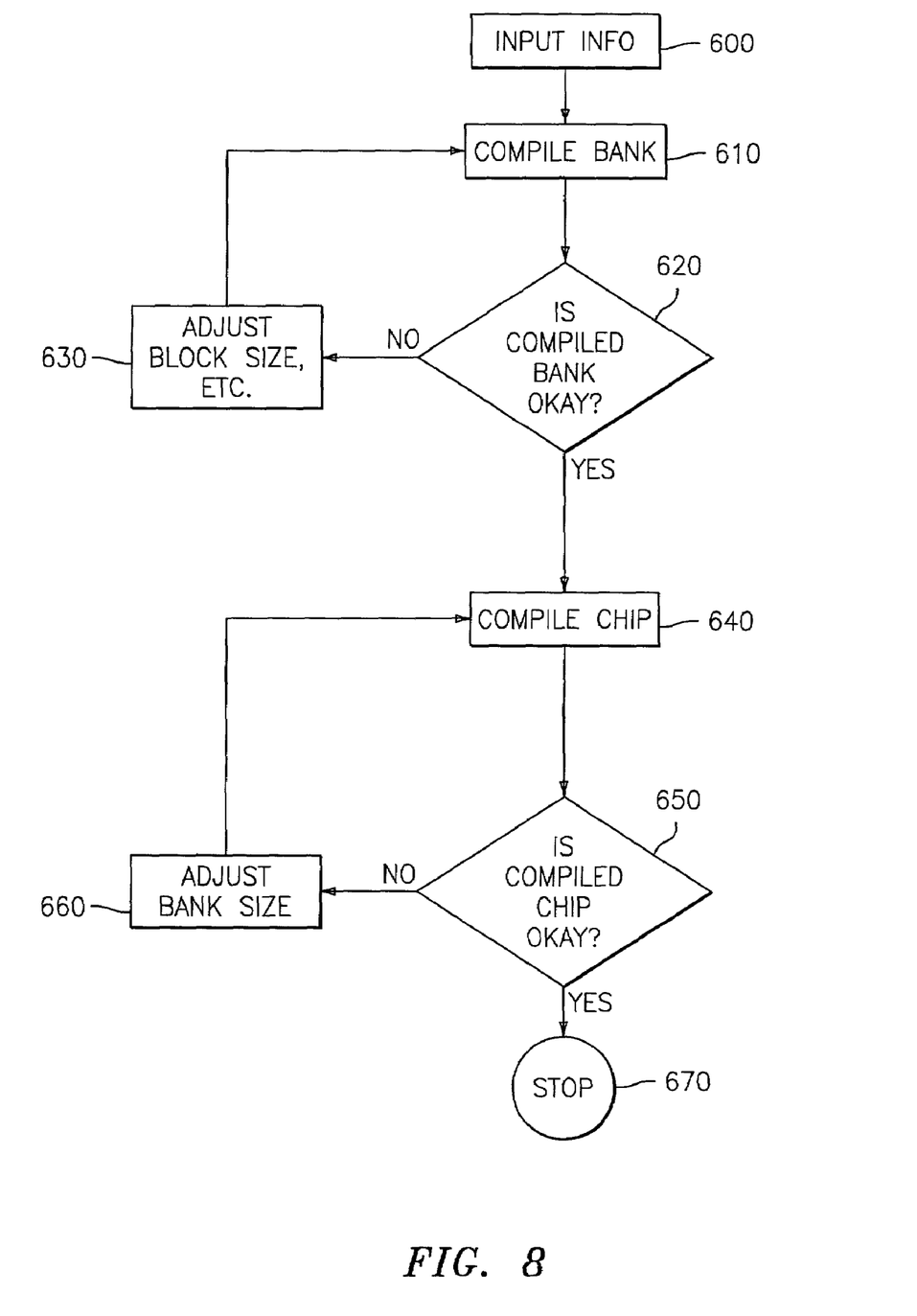
FIG. 8 is a flow chart of a compiler algorithm for compiling a DRAM macro according to the present invention.

With reference to FIG. 8, there is shown a flow chart of the compiler algorithm for compiling the compilable DRAM macro according to the present invention. The compiler algorithm is preferably stored within a processing unit's memory and executed by the processing unit after information is inputted by a user in step 600. The inputted information relates primarily to size, power, performance, and other characteristics and/or specifications. It is contemplated that the processing unit resides within a personal computer, a PDA, or server capable of being accessed via a network, such as the Internet.

The size information includes the aspect ratio (i.e., the ratio of array width to array height), the number of banks 10 and the I/O configuration. Other information relating to size can include the total chip density and the size of the chip, size of each memory cell in terms of x and y, and size of the decoders, sense amplifiers, support unit, etc. It is contemplated that some of the input parameters do not have to be received from a user, but could be determined from the input parameters actually received from the user. Once the input parameters are validated, the compiler algorithm can then select, place and connect the appropriate layout and schematic kernels hierarchically.

A reasonable block size is selected to form each bank 10 based on the inputted information. For example, each block 12 formed may contain 128 wordlines for high-performance, or 512 wordlines for medium performance. Once the block size is determined, the bank 10 is compiled in step 610 after the compiler algorithm calculates the timing, size and aspect ratio of the bank to be compiled. The precalculations directly determine which kernels are used, how many are placed, and how the connections are made. The bank size can be 1 Mb or some other size.

In step 620, the timing, size and aspect ratio of the compiled bank 10 are checked. If any of these parameters do not meet the user's requirements, the block and/or bank size, or other parameters, can be rearranged in step 630 until all parameters of the compiled bank 10 are satisfied. The build is then done by placing instances of the required kernels into the bank structure and specifying explicitly the schematic connections between those kernels and the ports that will be used at the next level up in the hierarchy of the chip.

Once the bank 10 is built, in step 640, the whole chip is compiled to meet the final memory capacity by compiling 2 Mb units. The 2 Mb units are compiled by placing instantiated instances of the bank structure into a 2 Mb unit structure. As with the bank structure, kernel selection, placement, and wiring need to be determined algorithmically. As many 2 Mb unit structures as needed, along with other kernels, can then be instantiated and placed into the top-level chip.

In step 650, the timing, size and aspect ratio of the compiled chip are checked. If any of these parameters do not meet the user's requirements, i.e., predetermined specifications, the chip is fixed by sizing and arranging the banks 10 and/or blocks 12 of each 2 Mb unit in step 660 until the compiled chip is satisfactory. The compiling process then ends at step 670.

What has been described herein is merely illustrative of the application of the principles of the present invention. For example, the functions described above and implemented as the best mode for operating the present invention are for illustration purposes only. As a particular example, for instance, other design configurations may be used for the compiler algorithm which provide similar operation as the compiler algorithm described above. Other arrangements and methods may be implemented by those skilled in the art without departing from the scope and spirit of this invention.

We claim:

1. A compiler contained in a computer for building at least one compilable DRAM unit including at least one compilable sub-array, the compiler comprising:

an algorithm for receiving input data; and an algorithm for determining a number of DRAM memory units for at least one DRAM unit, an I/O configuration for the number of DRAM memory units of the at least one DRAM unit, and for compiling the at least one DRAM unit having at least one corresponding support unit to provide the at least one compilable DRAM unit, wherein the at least one compilable DRAM unit conforms to the received input data, wherein the at least one corresponding support unit includes a redundancy circuit block and a DC generator and refresh block, and wherein the compiler compiles one or more sample wordlines and one or more real wordlines, determines timing of the compilable DRAM unit using at least one of the one or more compiled sample wordlines, and adjusts timing of the DRAM unit based on a propagation delay through the compiled sample wordline element.

2. The compiler according to claim 1, wherein the input data includes DRAM specifications relating to at least performance, size, I/O configuration, and power of the at least one compilable DRAM unit.

3. The compiler according to claim 1, wherein the number of DRAM memory units includes at least one block and at least one bank.

4. The compiler according to claim 3, wherein the at least one corresponding support unit further includes sense amplifiers, read and write registers, a timing circuit control block, an I/O bus zone.

5. The compiler according to claim 4, wherein the redundancy circuit block comprises redundancy circuits and registers for storing addresses of defective rows and columns.

6. The compiler according to claim 4, wherein the timing circuit control block comprises at least one master timing component and one local timing component.

7. The compiler according to claim 6, wherein the at least one master timing component includes the one or more compiled sample wordlines and the one or more compiled real wordlines and corresponding timing circuitry.

8. The compiler according to claim 7, wherein the one or more compiled real wordlines are connected to timing modules.

9. The compiler according to claim 8, wherein each timing module provides timing control to the at least one compilable sub-array such that the at least one compilable sub-array operates as an independent locally controlled DRAM.

10. The compiler according to claim 1, further including an algorithm for determining a number of the one or more sample wordlines, the one or more real wordlines, and bitlines for the at least one DRAM unit to provide an array aspect ratio for the at least one compilable DRAM unit which approximates an array aspect ratio provided by the received input data.

11. The compiler according to claim 1, wherein the compiler builds the at least one compilable sub-array based upon a required number of the one or more compiled sample wordlines, the one or more compiled real wordlines, and bitlines, and stacks the at least one compilable sub-array with other compilable sub-arrays.

12. A method for building at least one compilable DRAM including at least one compilable sub-array, the method comprising the steps of:

defining the at least one compilable sub-array included in the at least one compilable DRAM, the at least one compilable DRAM having at least one corresponding support unit including at least a redundancy circuit block, a DC generator and refresh block, one or more sample wordlines, and one or more real wordlines; and providing global control and local control to the at least one compilable sub-array such that it operates as a locally controlled DRAM, wherein the timing of the compilable DRAM is determined using at least one of the one or more sample wordlines; and adjusting timing of the DRAM unit based on a propagation delay through the compiled sample wordline element.

13. The method according to claim 12, further comprising the step of providing at least one global control signal for controlling the at least one compilable sub-array.

14. The method according to claim 12, wherein the step of defining the at least one compilable sub-array includes the steps of:

receiving a capacity and configuration of the at least one compilable sub-array; and determining a number of the one or more sample wordlines, the one or more real wordlines, and bitlines required to build the at least one compilable sub-array to conform to the received capacity and configuration.

15. The method according to claim 12, further comprising the step of optimizing performance of the at least one compilable sub-array.

16. The method according to claim 15, wherein the step of optimizing performance includes the step of optimizing access time and cycle time of the at least one compilable sub-array.

17. The method according to claim 12, further comprising the step of performing the steps of the method by a processing unit executing a compiler.

18. A method for compiling at least one compilable DRAM unit including at least one compilable sub-array, the method comprising the steps of:

receiving input data; and determining a number of DRAM memory units for at least one DRAM unit, and an I/O configuration for the number of DRAM memory units of the at least one DRAM unit; and compiling the at least one DRAM unit having at least one corresponding support unit to provide the at least one compilable DRAM unit, the compilable DRAM unit including one or more sample wordlines;

wherein the at least one corresponding support unit includes a redundancy circuit block and a DC generator and refresh block and further wherein the timing of the compilable DRAM unit is determined using at least the one or more sample wordlines, and the timing of the compilable DRAM unit is adjusted based on a propagation delay through the compiled sample wordline element.

19. The method according to claim 18, wherein the step of determining the number of DRAM memory units further includes determining a number of the one or more sample wordlines, real wordlines, and bitlines for the at least one DRAM unit to provide an array aspect ratio for the at least one compilable DRAM unit which approximates an array aspect ratio provided by the received input data.

20. The method according to claim 18, further comprising the steps of:

checking the at least one compilable DRAM unit to determine whether the at least one compilable DRAM unit conforms to the received input data; and adjusting at least the size of the number of DRAM memory units if the at least one compilable DRAM does not conform to the received input data.

21. The method according to claim 20, further comprising the steps of:

compiling a chip which includes the at least one compilable DRAM unit;

determining whether the compiled chip meets predetermined specifications; and adjusting at least the size of the number of DRAM memory units if the compiled chip does not meet predetermined specifications.

22. A method for building a compilable DRAM macro, the compilable DRAM macro including at least one compilable subarray included in the at least one compilable DRAM macro, the at least one compilable DRAM macro having at least one corresponding support unit including at least a redundancy circuit block, a DC generator and refresh block, one or more sample wordlines, and one or more real wordlines, the method comprising the steps of:

receiving input data including an array aspect ratio;

adjusting the length of a real wordline element based on the input data;

compiling a sample wordline element based on the input data; and adjusting timing of the DRAM macro based on a propagation delay through the compiled sample wordline element.

23. The method of claim 22, wherein:

optimum timing between generation of a wordline drive signal and the activation of a bitline sense amplifier is determined using the compiled sample wordline element.

* * * * *